(12) United States Patent
Miura et al.

(10) Patent No.: US 6,756,803 B2
(45) Date of Patent: Jun. 29, 2004

(54) SEMICONDUCTOR DEVICE DOWNSIZING ITS BUILT-IN DRIVER

(75) Inventors: Manabu Miura, Tokyo (JP); Makoto Hatakenaka, Tokyo (JP); Takekazu Yamashita, Nagasaki (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 104 days.

(21) Appl. No.: 10/330,072

(22) Filed: Dec. 30, 2002

(65) Prior Publication Data

US 2004/0027150 A1 Feb. 12, 2004

(30) Foreign Application Priority Data

Jul. 29, 2002 (JP) ........................................ 2002-220079

(51) Int. Cl.$^7$ ............................................... G01R 31/02
(52) U.S. Cl. ......................................... 324/763; 257/48
(58) Field of Search ................................ 324/763, 764, 324/765, 158.1, 755; 327/564, 527, 565; 702/111, 118, 120; 438/15, 18; 257/48, 40

(56) References Cited

U.S. PATENT DOCUMENTS 6,304,098 B1 * 10/2001 Drost et al. ................... 326/26
6,515,501 B2 * 2/2003 Bosnyak et al. ............... 326/30

FOREIGN PATENT DOCUMENTS

JP          7-303030       11/1995
JP          2001-294539    10/2001

* cited by examiner

Primary Examiner—Kamand Cuneo
Assistant Examiner—Trung Nguyen
(74) Attorney, Agent, or Firm—Burns, Doane, Swecker & Mathis, LLP

(57) ABSTRACT

A semiconductor device includes a first pad, a second pad, a first buffer and a second buffer. The first pad is connected to another semiconductor device in a multi-chip package, and the second pad makes a probing connection in a wafer test. The first buffer drives the another semiconductor device connected to the first pad. The second buffer, being driven by the first buffer, drives a load capacitance of a tester connected to the second pad with the driving power greater than the driving power of the first buffer, and has its active/inactive state controlled by a control signal. The semiconductor device can provide the driving power necessary for the wafer test, and drive the another semiconductor device with preventing generation of drive noise and suppressing current consumption in the normal operation of the multi-chip package.

10 Claims, 13 Drawing Sheets

SEMICONDUCTOR DEVICE DOWNSIZING ITS BUILT-IN DRIVER

BACKGROUND OF THE INVENTION

1. Field of the Invention

The present invention relates to a semiconductor package that mounts a plurality of semiconductor chips in combination, and merges them by installing wiring between the chips to exchange data, that is, to a semiconductor device assembled in a multi-chip package.

2. Description of Related Art

Recently, an increasing number of multi-chip packages (called "MCPs" from now on) have been used in electronic equipment such as mobile phones requiring miniaturization and versatility, as semiconductor products meeting demands of equipment manufacturers. The MCP consists of one package including combinations of LSIs such as logic and memory, digital and analog, and flash memory and SRAM LSIs, which are stacked and have wiring installed between the chips by wire bonding.

FIG. 13 is a block diagram showing a schematic internal configuration of a conventional multi-chip package including two-chips (semiconductor devices) combined together. In FIG. 13, the reference numeral 1100 designates an MCP, and reference numerals 1110 and 1120 each designate a chip constituting a semiconductor device mounted on the MCP 1100. Although the two chips usually have different types of functions, it is not unlikely that they belong to the same type. In either case, they are assembled into the multi-chip structure to transfer data in one direction from one chip to the other, or to exchange data between them.

In the first chip 1110, the reference numeral 500 designates an internal circuit, reference numerals 410 and 420 each designate an input buffer for the internal circuit 500, and 430 and 440 each designate an output buffer. Reference numerals 101–104 designate pads that are formed on the chip, and are connected to the input terminals of the input buffers 410 and 420 and the output terminals of the output buffers 430 and 440, respectively. Reference numerals 105 each designate a pad for one of other input/output terminals of the internal circuit 500 (not shown for the sake of simplicity). In the second chip 1120, the reference numeral 501 designates an internal circuit, 411 designates an input buffer for the internal circuit 501, and 441 designates an output buffer. The reference numeral 201 designates a pad formed on the chip 1120 to be connected to the input terminal of the input buffer 411. Reference numerals 202, 203 and 205 each designate a pad to be connected to one of the input/output terminals of the internal circuit 501 (not shown for the sake of simplicity). Both the chips 1110 and 1120 have a configuration for exchanging data. Specifically, the pads 101 and 204 and the pads 104 and 201 are each interconnected by wires 701 and 702. Thus, the output of the buffer 440 of the chip 1110 drives the chip 1120 via the pads 104 and 201, and the output of the buffer 441 of the chip 1120 is supplied to the internal circuit 500 of the chip 1110 via the pads 204 and 101. Reference numerals 601–606 designate external terminals of the MCP 1100 used for the chip 1110, which are connected to the pads 102, 103 and 105 via the wires 703–708. Reference numerals 611–616 designate external terminals of the MCP 1100 used for the chip 1120, which are connected to the pads 202, 203 and 205 via wires 723–728.

Generally, the pads, that is, the input/output terminals and output terminals of the semiconductor devices mounted on the MCP, fall into two types: the first type of pad is used for the external input/output terminals and output terminals after assembly (used in a state in which the MCP is installed into electronic equipment); and the second type of pad is used for the input and output only between the semiconductor devices assembled into the MCP.

As for the second type, Japanese patent application No. 2001-294539 applied by the assignee of the present invention discloses it. It discloses a configuration that controls the output driving power of the output buffer 440 by using a control signal 150 as shown in FIG. 13. FIG. 14 shows an example of the circuit configuration of the output buffer 440.

In FIG. 14, the reference numeral 443 designates a normally used driver, and 444 designates a power adjusting driver. The output buffer 440 is supplied with a signal from the internal circuit 500 of FIG. 13 as its input signal 160, and its output appears at the output pad 104. At a wafer test, the control signal 150 is placed at a "H" (high) level to enable the power adjusting driver 444. Thus, the output buffer 440 can increase its driving power so that it can drive a large load capacitance of a tester. In addition, in the normally used state after the assembly, the power adjusting driver 444 is disabled by placing the control signal 150 at a "L" (low) level. Thus, the output buffer 440 can reduce its driving power after assembly, so that it drives only the another semiconductor device mounted on the MCP, that is, only the chip 1120 in the example of FIG. 13. By thus switching the driving power in accordance with the usage condition, the output buffer 440 can drive the wiring between the chips in the MCP 1100 with smaller driving power in the normally used mode, thereby curbing the generation of drive noise affecting the operation, and limiting the increase in current consumption at the operation.

With the foregoing configuration, the conventional MCP has the following problems. First, consider the state in which the output buffer must drive only the another semiconductor device installed in the MCP after the assembly. In this case, the output buffer 440 carries out its driving through the normally used driver 443 only. In the course of this, the normally used driver 443 must always drive the drain capacitance of a P-channel transistor 446 and N-channel transistor 447 constituting the power adjusting driver 444. In other words, even though the output buffer 440 is controlled such that its driving power is reduced to drive only the another semiconductor device, it must simultaneously drive with its small driving power the drain capacitance of the power adjusting driver 444 in the off state. Accordingly, the size of the normally used driver 443 must be determined considering the drain capacitance of the power adjusting driver 444 in the off state. This offers a problem of increasing the current consumption by that amount.

Second, as for the semiconductor devices to be installed in the MCP, and a structure provided for driving the another semiconductor device in the conventional technique to implement the MCP, the following problem arises. It is impossible for the output buffer 440 to restrict its size to a small one because the normally used driver 443 requires the driving power for driving the drain capacitance of the power adjusting driver 444 in the off state. For this reason, countermeasures against the noise generation and current consumption at the operation are limited, which hinders the optimization of the MCP product.

SUMMARY OF THE INVENTION

The present invention is implemented to solve the foregoing problems. It is therefore an object of the present invention to provide a semiconductor device that can supply the driving power required for a wafer test, and drive the another semiconductor device installed in the MCP while restricting the current consumption and preventing the drive noise adversely affecting the normal operation.

According to a first aspect of the present invention, there is provide a semiconductor device including: a first pad to be connected to another semiconductor device; a second pad for making a probing connection in a wafer test; a first buffer connected to the first pad for driving the another semiconductor device; and a second buffer driven by the first buffer, for driving a load capacitance of a tester connected to the second pad by driving power greater than that of the first buffer, the second buffer having its active/inactive state controlled by a control signal. Thus, it can drive the another semiconductor device through the first buffer with the smaller driving power after assembly. In the wafer test, it can drive the load capacitance of the tester through the second buffer with the greater driving power. Consequently, it offers an advantage of being able to suppress noise generation and current consumption during the operation. In particular, it can reduce the power consumption in the buffer in the normal mode.

According to a second aspect of the present invention, there is provided a multi-chip package including at least a first chip and a second chip, wherein the first chip has the same configuration as the semiconductor device of the first aspect, and the second buffer is controlled by the control signal to an active state during the wafer test, and to an inactive state during a normal operation of the multi-chip package.

DETAILED DESCRIPTION OF THE PREFERRED EMBODIMENTS

The embodiments in accordance with the invention will now be described with reference to the accompanying drawings.

EMBODIMENT 1

Figure 1:
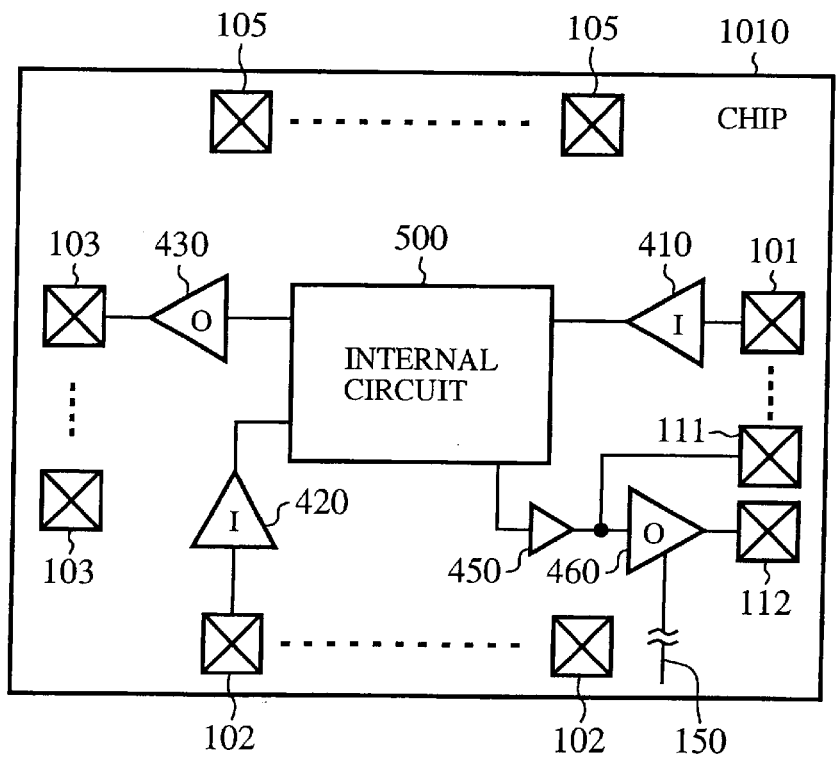
FIG. 1 is a block diagram showing a schematic configuration of a chip to be installed into a multi-chip package of an embodiment 1 in accordance with the present invention.

FIG. 1 is a block diagram showing a schematic configuration of a chip (semiconductor device) to be installed in a multi-chip package of an embodiment 1 in accordance with the present invention. In FIG. 1, the reference numeral 1010 designates a chip (semiconductor device). In the chip 1010, the reference numeral 500 designates an internal circuit, reference numerals 410 and 420 each designate an input buffer for the internal circuit 500, and the reference numeral 430 designates an output buffer. Reference numerals 101–103 designate pads that are formed on the chip, and connected to the input terminals of the input buffers 410 and 420, and to the output terminal of the output buffer 430. Reference numerals 105 each designate a pad for another input or output of the internal circuit 500 (not shown for the sake of simplicity).

The chip 1010 is a first semiconductor device to be incorporated into the MCP. It has a first pad 111 to be connected to an another semiconductor device (not shown in FIG. 1) and a second pad 112 for making a probing connection for a wafer test. The first pad 111 is connected to the output of the first buffer 450, and the second pad 112 is connected to the output of the second buffer 460. In addition, the output of the first buffer 450 is connected to the input of the second buffer 460. It is assumed here that the driving power of the second buffer 460 is designed to be greater than that of the first buffer 450.

Figure 14:
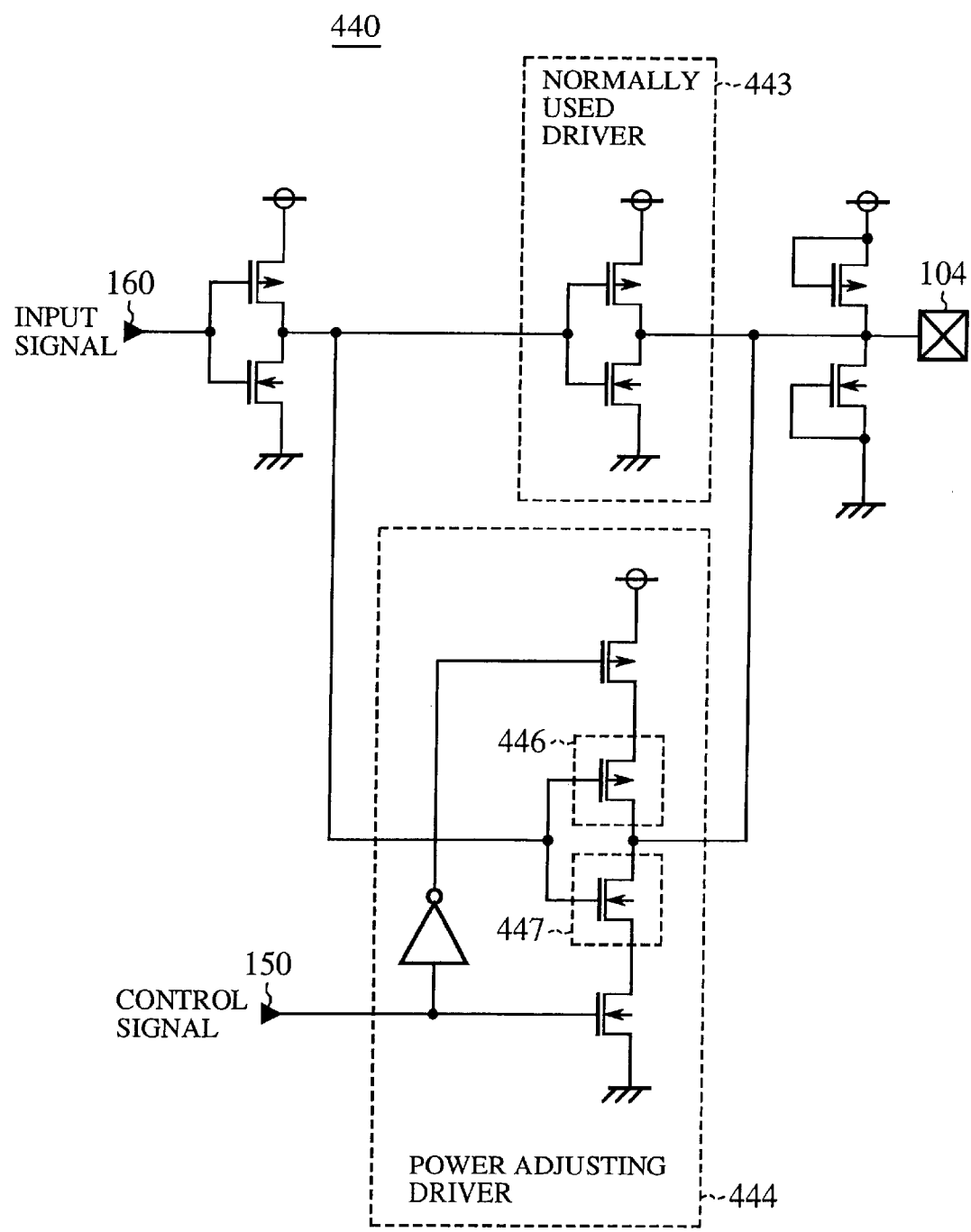
FIG. 14 is a circuit diagram showing a configuration of a conventional output buffer.

In the chip 1010, the first pad 111 connected to the buffer 450 with smaller driving power is used after assembly, while the second pad 112 connected to the second buffer 460 with greater driving power is used for the wafer test. This makes it possible for the chip 1010 to drive the load capacitance of a tester more sufficiently than the conventional chip in the wafer test by making probing connection to the second pad 112 connected to the second buffer 460 with the greater driving power. On the other hand, since the chip 1010 is connected after the assembly to the second chip via the first pad 111 connected to the first buffer 450 with the driving power smaller than that of the conventional example, it offers little problem of the noise generation and increase in the current consumption during the operation. The driving power of the first buffer 450 can be smaller than the conventional power because it is not necessary for the first buffer 450 to drive the drain capacitance of the power adjusting driver 444 of the conventional output driver as shown in FIG. 14.

Figure 2A:
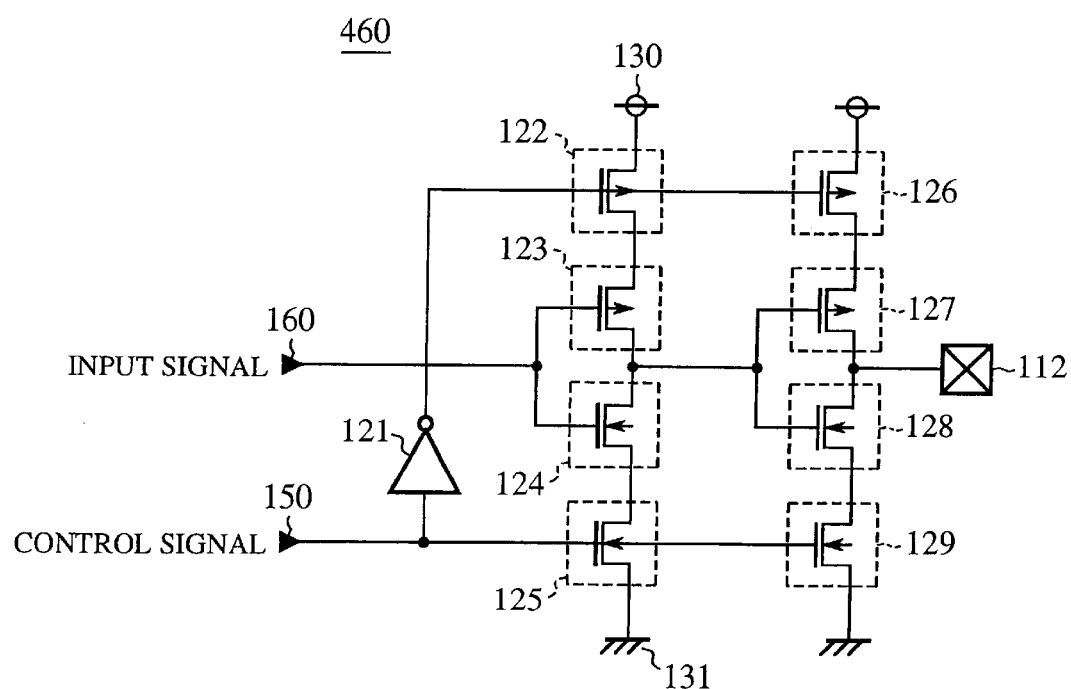
FIGS. 2A and 2B are circuit diagrams each showing a configuration of a second buffer of the embodiment 1.
Figure 2B:
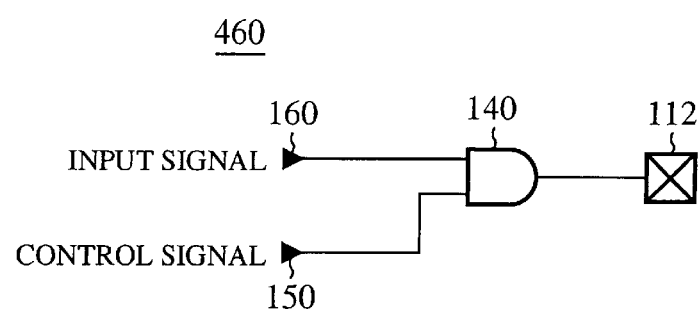

FIGS. 2A and 2B are circuit diagrams each showing a configuration of the second buffer 460 of the embodiment 1. FIG. 2A is a configuration based on a clock gate scheme, and FIG. 2B is a configuration using an AND circuit. They are both controlled as to whether to supply an input signal 160 to the second pad 112 or not in response to a control signal 150 that controls the operation state in accordance with the wafer state or assembly state.

The circuit of FIG. 2A comprises a P-channel transistor 123 and an N-channel transistor 124 which are supplied with an input signal 160, a P-channel transistor 127 and an N-channel transistor 128 which are supplied with the drain output of the P-channel transistor 123 and N-channel transistor 124, N-channel transistors 125 and 129 turned on and off in response to the control signal 150, and P-channel transistors 122 and 126 turned on and off in response to the inverted signal of the control signal 150.

The N-channel transistors 125 and 129 that are turned on and off in response to the control signal 150 have their sources supplied with a ground potential 131. The N-channel transistor 125 has its drain supplied with a source potential of the N-channel transistor 124, and the N-channel transistor 129 has its drain supplied with the source potential of the N-channel transistor 128. The P-channel transistors 122 and 126 that are turned on and off in response to the inverted signal of the control signal 150 have their sources supplied with a power supply potential 130. The P-channel transistor 122 has its drain supplied with the source potential of the P-channel transistor 123, and the P-channel transistor 126 has its drain supplied with the source potential of the P-channel transistor 127. The input signal 160 is output from the drains of the P-channel transistor 123 and N-channel transistor 124 to be supplied to the P-channel transistor 127 and N-channel transistor 128. The output of the P-channel transistor 127 and N-channel transistor 128, which is extracted from their drains, appears on the second pad 112.

In the wafer test, the control signal 150 is placed at a "H" (high) level to set the second buffer 460 at an active state. In response to the control signal 150, the N-channel transistors 125 and 129 and the P-channel transistors 122 and 126 which are turned on and off in response to the inverted signal of the control signal 150, are all brought into the ON state, thereby transferring the input signal 160 to the second pad 112. After the assembly, one the other hand, the control signal 150 is placed at a "L" (low) level to set the second buffer 460 at an inactive state. Then, the N-channel transistors 125 and 129 and the P-channel transistors 122 and 126 which are turned on and off in response to the inverted signal of the control signal 150, are all brought into the OFF state, thereby preventing the transfer of the input signal 160 to the second pad 112.

FIG. 2B shows another configuration of the second buffer 460 comprising an AND circuit 140 for ANDing the input signal 160 and the control signal 150, and supplies its output to the second pad 112.

In the wafer test, the control signal 150 is placed at the "H" level to bring the second buffer 460 into the active state, so that the input signal 160 is transferred to the second pad 112 through the AND circuit 140. After the assembly, on the other hand, the control signal 150 is placed at the "L" level to bring the second buffer 460 to the inactive state, so that the AND circuit 140 has its output fixed at the "L" level regardless of the input signal 160. Thus, it prevents the transfer of the input signal 160 to the second pad 112.

Although the control signal 150 is usually supplied from the outside as needed, it can be set internally depending on the configuration of the chip.

As described above, the active/inactive state of the second buffer 460 is controllable. Thus, bringing it into the inactive state after the wafer test makes it possible to implement the lower power consumption and to prevent the noise generation, thereby being able to optimize the MCP product.

As described above, the present embodiment 1 is configured such that the chip (semiconductor device) 1010 includes the first pad 111 to be connected to the another semiconductor device installed in the MCP; the second pad 112 for making the probing connection in the wafer test; the first buffer 450 for driving the another semiconductor device connected to the first pad 111; and the second buffer 460, being driven by the first buffer 450, drives the load capacitance of the tester connected to the second pad 112 by the driving power greater than that of the first buffer 450, and has its active/inactive state controlled in response to the control signal 150. Thus, the present embodiment drives the another semiconductor device by the first buffer 450 with the smaller driving power after the assembly, whereas it drives the load capacitance of the tester by the second buffer 460 with the greater driving power in the wafer test. As a result, the present embodiment offers an advantage of being able to prevent the noise generation and to limit the increase in the current consumption during the operation.

EMBODIMENT 2

Figure 3:
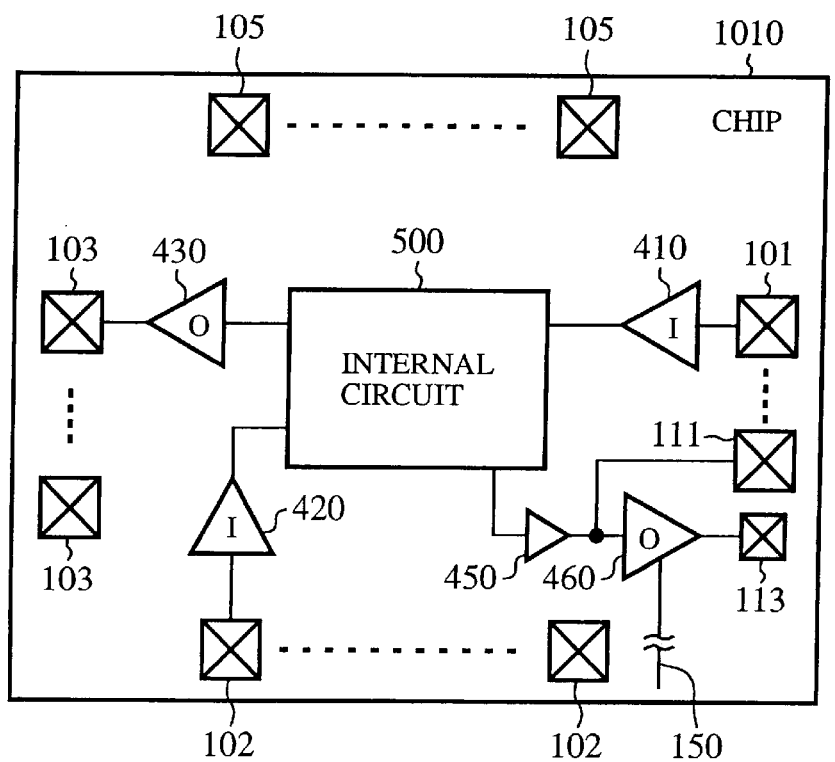
FIG. 3 is a block diagram showing a schematic configuration of a chip to be installed into a multi-chip package of an embodiment 2 in accordance with the present invention.

FIG. 3 is a block diagram showing a schematic configuration of a chip (semiconductor device) to be installed in the multi-chip package of an embodiment 2 in accordance with the present invention. In a chip 1011 as shown in FIG. 3, the reference numeral 500 designates an internal circuit, reference numerals 410 and 420 each designate an input buffer for the internal circuit 500, and the reference numeral 430 designates an output buffer. Reference numerals 101–103 designate pads that are formed on the chip, and connected to the input terminals of the input buffers 410 and 420 and to the output terminal of the output buffer 430. Each reference numeral 105 designates a pad for another input/output of the internal circuit 500 (not shown for the sake of simplicity).

The chip 1011 is a first semiconductor device to be incorporated into the MCP. It has a first pad 111 to be connected to an another semiconductor device and a second pad 113 for making a probing connection for a wafer test. The first pad 111 is connected to the output of the first buffer 450, and the second pad 113 is connected to the output of the second buffer 460. In addition, the output of the first buffer 450 is connected to the input of the second buffer 460. Here, the driving power of the second buffer 460 is designed to be greater than that of the first buffer 450.

The present embodiment 2 differs from the foregoing embodiment 1 in that the second pad 113 is made smaller in size than the first pad 111. Although the first pad 111 must have a pad size needed for bonding wire at the assembly, it is enough for the second pad 113 to have a pad size necessary for the probing of the wafer test.

As described above, the present embodiment 2 is configured such that the chip 1011 includes the first pad 111 to be connected to the another semiconductor device installed in the MCP; the second pad 113 for making the probing connection in the wafer test; the first buffer 450 for driving the another semiconductor device connected to the first pad 111; and the second buffer 460, being driven by the first buffer 450, drives the load capacitance of the tester connected to the second pad 113 by the driving power greater than that of the first buffer 450, and has its active/inactive state controlled in response to the controllable control signal 150. Thus, the present embodiment 2 drives the another semiconductor device by the first buffer 450 with the smaller driving power after the assembly, whereas it drives the load capacitance of the tester by the second buffer 460 with the greater driving power in the wafer test. As a result, the present embodiment 2 offers an advantage of being able to prevent the noise generation and to limit the increase in the current consumption during the operation. In addition, since the size of the first pad 113 is made smaller than that of the second pad 111, the present embodiment offers an advantage of being able to reduce the chip size.

EMBODIMENT 3

Figure 4:
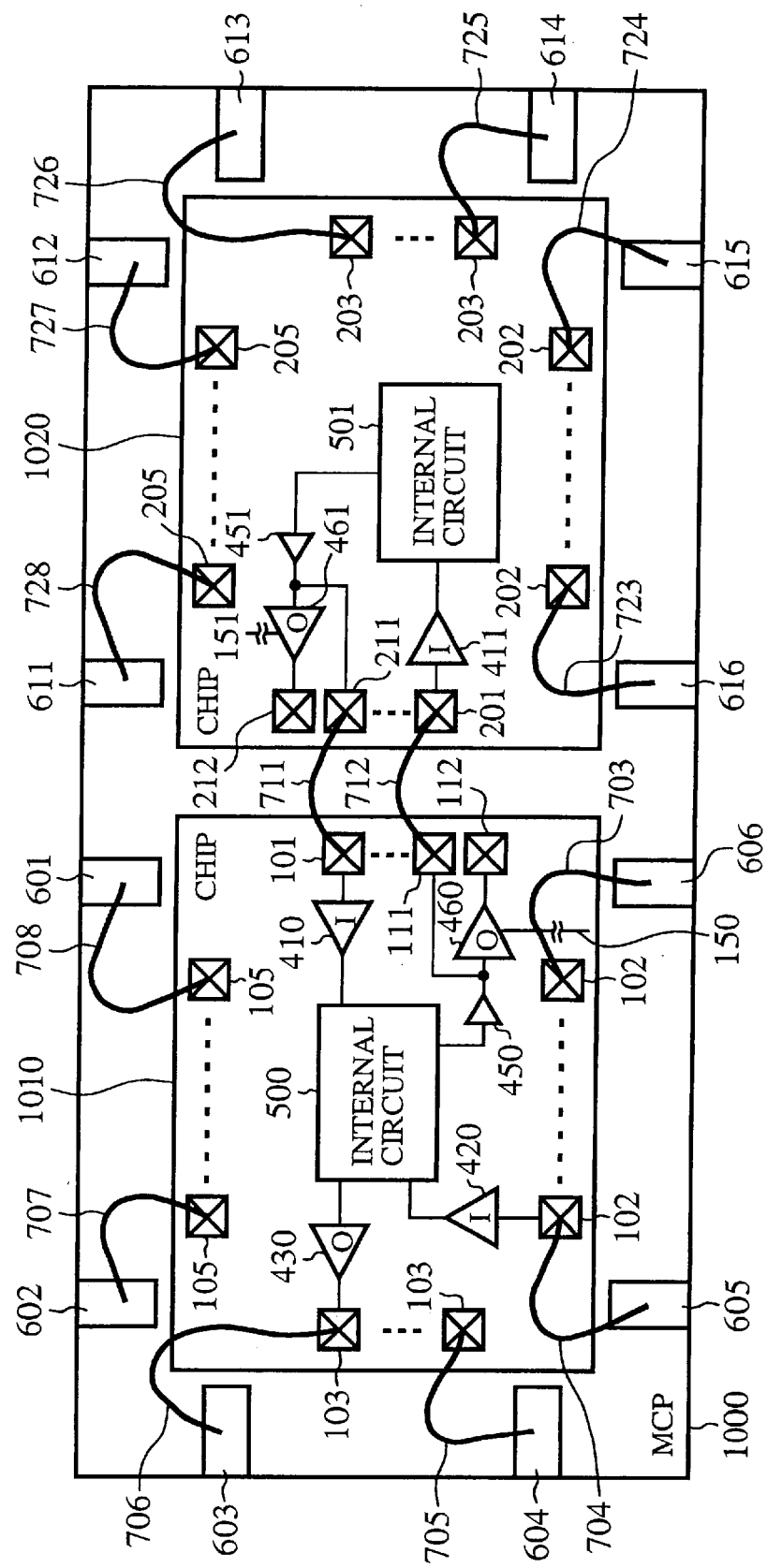
FIG. 4 is a block diagram showing a schematic internal configuration of a multi-chip package of an embodiment 3 in accordance with the present invention.

FIG. 4 is a block diagram showing a schematic internal configuration of a multi-chip package of an embodiment 3 in accordance with the present invention. In FIG. 4, the reference numeral 1000 designates an MCP, and reference numerals 1010 and 1020 each designate a semiconductor device incorporated into the MCP 1000. Although the two semiconductor devices usually consist of chips with different types of functions, they may be chips of the same type. In either case, the MCP has a multi-chip structure for supplying data from a first chip to a second chip, or for exchanging data between them. The chips 1010 and 1020 built in the MCP 1000, which employs the multi-chip structure to exchange data between the two chips, have the different types of functions, and correspond to the chip described above in the embodiment 1.

In the chip 1010, the reference numeral 500 designates an internal circuit, reference numerals 410 and 420 each designate an input buffer for the internal circuit 500, and the reference numeral 430 designates an output buffer. Reference numerals 101–103 designate pads that are formed on the chip, and connected to the input terminals of the input buffers 410 and 420, and to the output terminal of the output buffer 430. Reference numerals 105 each designate a pad for another input or output of the internal circuit 500 (not shown for the sake of simplicity). The chip 1010 includes a first pad 111 to be connected to the second chip 1020 and a second pad 112 for making a probing connection for a wafer test. The first pad 111 is connected to the output of the first buffer 450, and the second pad 112 is connected to the output of the second buffer 460. In addition, the output of the first buffer 450 is connected to the input of the second buffer 460. The driving power of the second buffer 460 is designed to be greater than that of the first buffer 450.

In the second chip 1020, the reference numeral 501 designates an internal circuit, and 411 designate an input buffer for the internal circuit 501. The reference numeral 201 designates a pad that is formed on the chip and connected to the input terminal of the input buffer 411. Reference numerals 202, 203 and 205 each designate a pad for another input or output of the internal circuit 501 (not shown for the sake of simplicity). The second chip 1020 includes a first pad 211 connected to the first chip 1010, and a second pad 212 for making a probing connection for wafer test. The first pad 211 is connected to the output of the first buffer 451, and the second pad 212 is connected to the output of the second buffer 461. In addition, the output of the first buffer 451 is connected to the input of the second buffer 461. The driving power of the second buffer 461 is designed to be greater than that of the first buffer 451.

The two chips 1010 and 1020 have connections for exchanging data. Specifically, the pads 101 and 211 and the pads 111 and 201 are interconnected by wires 711 and 712, respectively. Thus, the output of the buffer 450 of the chip 1010 drives the chip 1020 via the pads 111 and 201, and the output of the buffer 451 of the chip 1020 drives the chip 1010 via the pads 211 and 101. Reference numerals 601–606 designate external terminals of the MCP 1000, which are used by the chip 1010 and connected to the pads 102, 103 and 105 via the wires 703–708. Reference numerals 611–616 designate external terminals of the MCP 1000, which are used by the chip 1020 and connected to the pads 202, 203 and 205 via wires 723–728. The second pad 112 of the chip 1010 and the pad 212 of the chip 1020 are placed at the open state without wiring.

In the chip 1010 assembled into the MCP 1000, the first buffer 450 with the smaller driving power receives the signal output from the internal circuit 500, and supplies it to the first pad 111. The signal is transferred to the pad 201 of the chip 1020 via the wire 712, and arrives at the internal circuit 501 via the input buffer 411. The signal is simultaneously supplied to the second buffer 460 with the greater driving power. After the assembly of the MCP 1000, however, since the second buffer 460 is controlled to the inactive state in response to the control signal 150, the pad 112 connected to its output is fixed at the "H" or "L" potential, or brought to a high impedance state. Likewise, in the chip 1020, the first buffer 451 with the smaller driving power receives the signal output from the internal circuit 501, and supplies it to the first pad 211. The signal is transferred to the pad 101 of the chip 1010 via the wire 711, and arrives at the internal circuit 500 via the input buffer 410. The signal is simultaneously supplied to the second buffer 461 with the greater driving power. After the assembly of the MCP 1000, however, since the second buffer 461 is controlled to the inactive state in response to the control signal 151, the pad 212 connected to its output is fixed at the "H" or "L" potential, or brought to the high impedance state.

As described above, the present embodiment 3 is configured such that the first buffers 450 and 451 with the smaller driving power drive the other semiconductor devices 1020 and 1010 assembled into the MCP 1000, and that the pads 112 and 212 connected to the second buffers 460 and 461 with the greater driving power are placed at the open state. In addition, the second buffers 460 and 461 are controlled to the inactive state in response to the control signals 150 and 151. Thus, the present embodiment 3 offers an advantage of being able to prevent the noise generation and to limit an increase in the current consumption during the operation. Furthermore, it can configure the MCP 1000 using the output buffers with the optimum driving power for the MCP.

Figure 5:
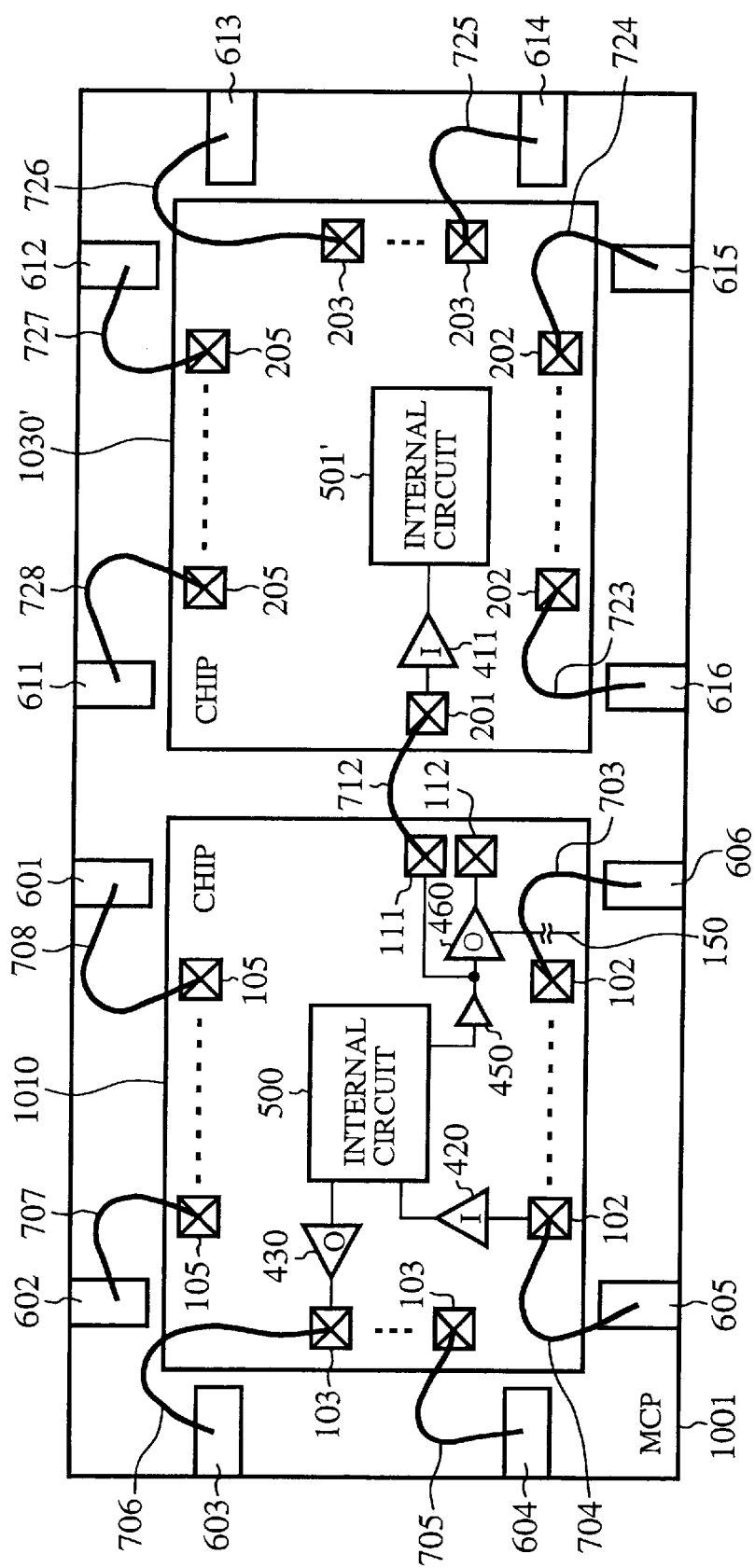
FIG. 5 is a block diagram showing another schematic internal configuration of the multi-chip package of the embodiment 3.

The chips 1010 and 1020 installed in the MCP 1000, which is an example having the multi-chip structure for exchanging data between the two chips, have the different types of functions, and correspond to the chip as described above in the embodiment 1. The present invention, however, is also applicable to a configuration as shown in FIG. 5 that has a multi-chip structure for transferring data only in one direction from the first chip to the second chip, offering the same advantages.

Figure 6:
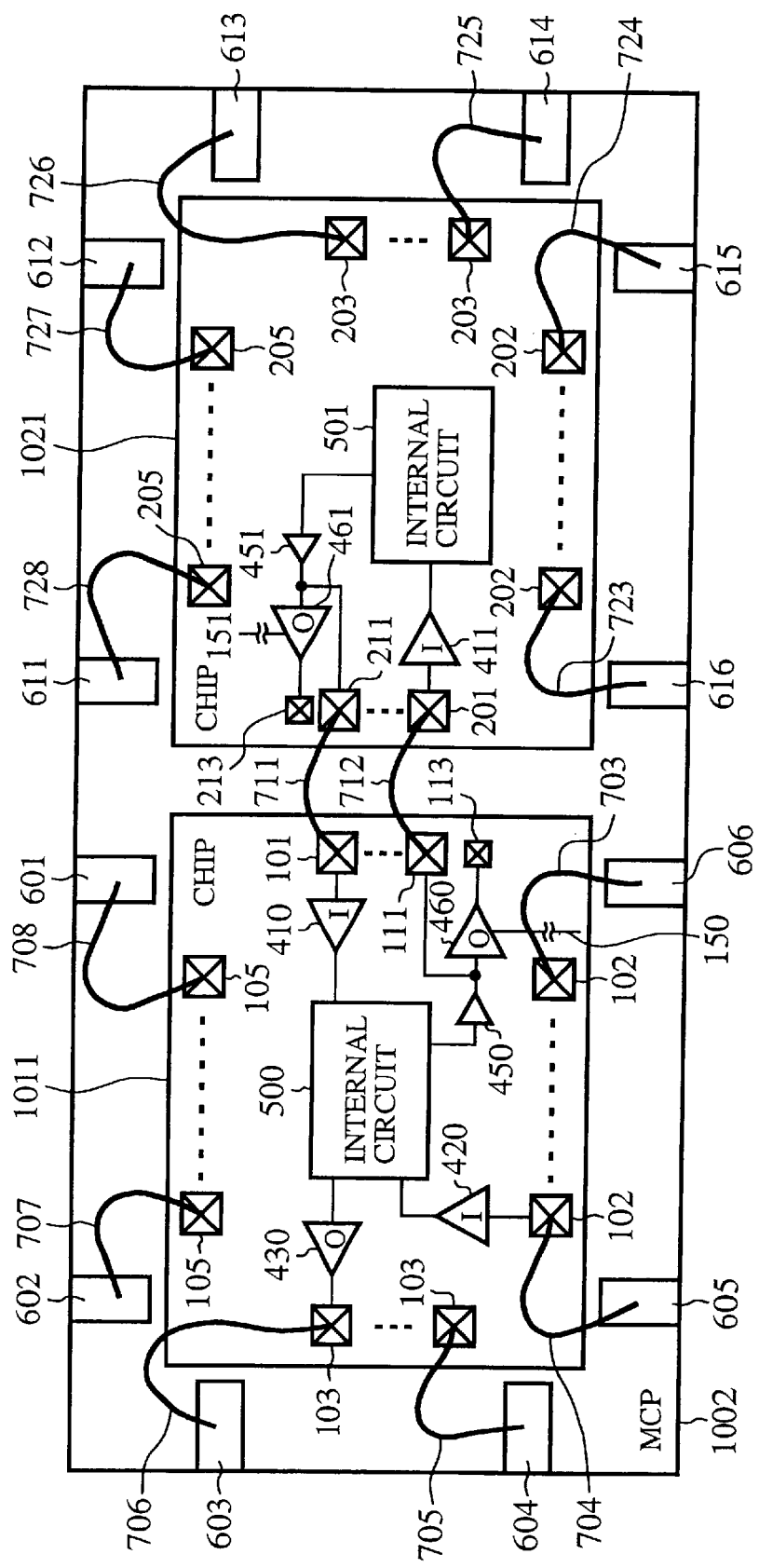
FIG. 6 is a block diagram showing still another schematic internal configuration of the multi-chip package of the embodiment 3.
Figure 7:
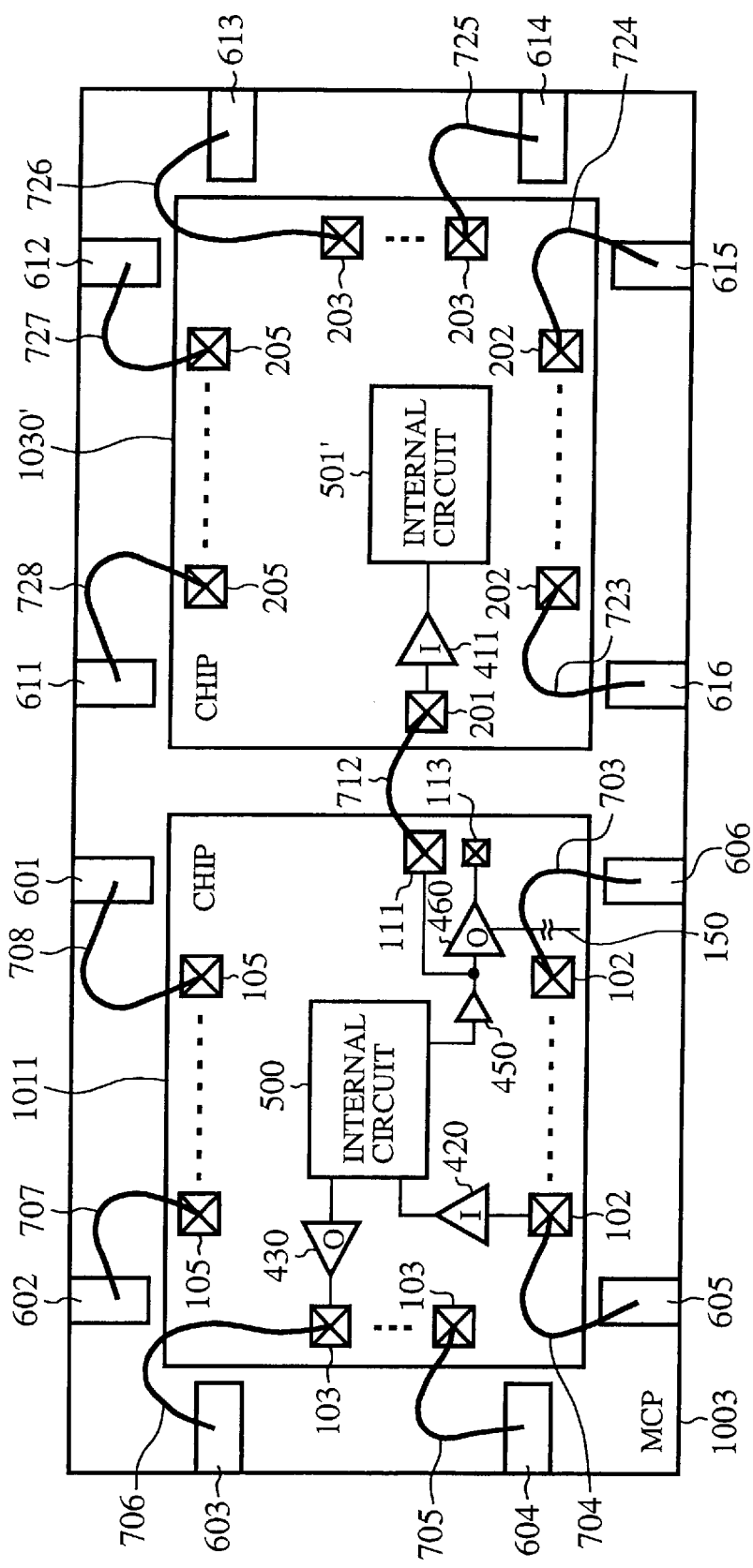
FIG. 7 is a block diagram showing another schematic internal configuration of the multi-chip package of the embodiment 3.

In addition, although the chips 1010 and 1020 installed in the MCP 1000, which is an example having the multi-chip structure for exchanging data between the two chips, have the different types of functions, and correspond to the chip as described above in the embodiment 1, the chip corresponding to the foregoing embodiment 2 is also applicable. FIG. 6 shows such a configuration, which offers the same advantages. The chip corresponding to the foregoing embodiment 2 is also applicable to the multi-chip structure where the data is supplied only in one direction from the first chip to the second chip as shown in FIG. 7, offering the same advantages.

EMBODIMENT 4

Figure 8:
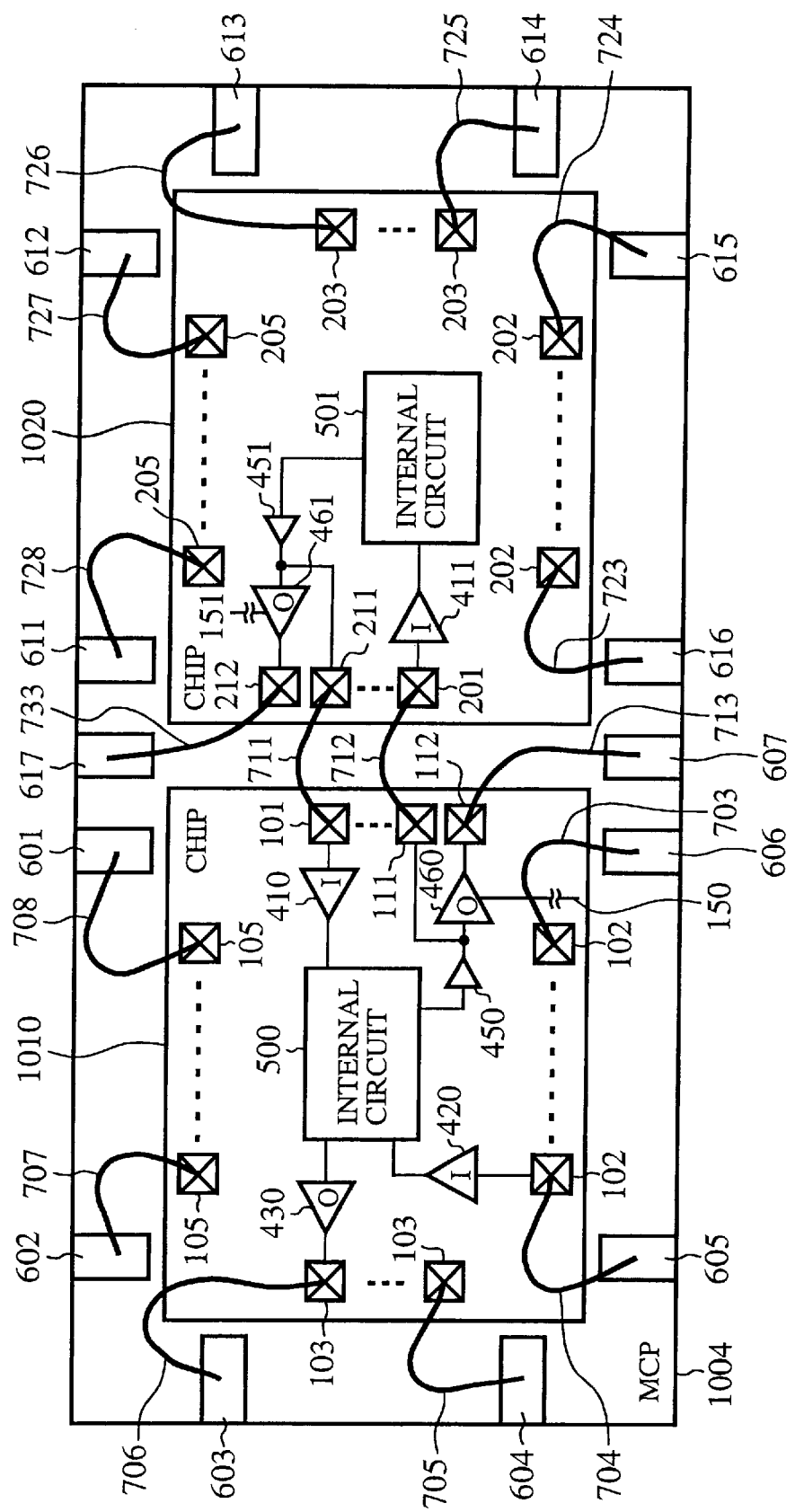
FIG. 8 is a block diagram showing a schematic internal configuration of a multi-chip package of an embodiment 4 in accordance with the present invention.
Figure 9:
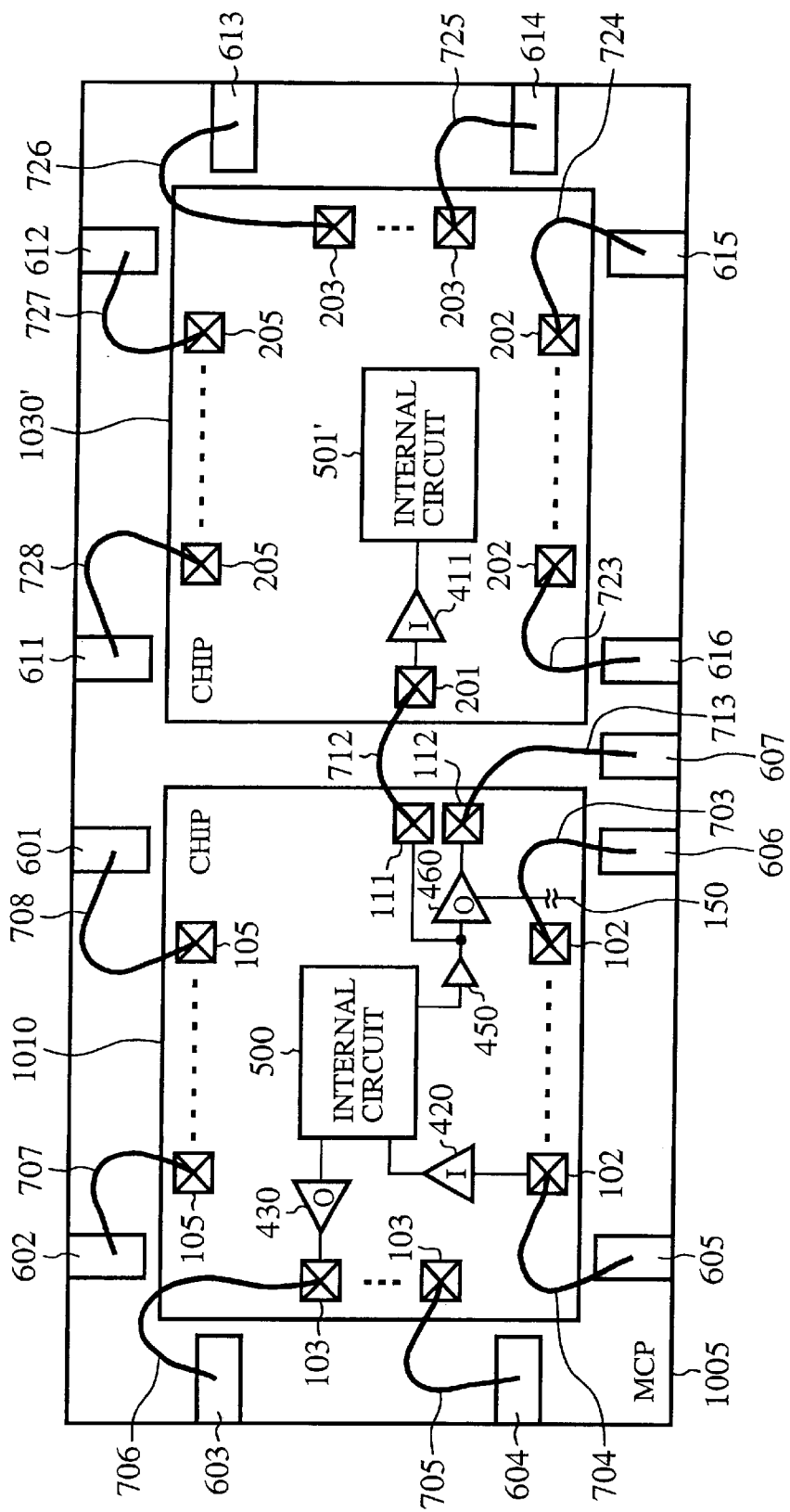
FIG. 9 is a block diagram showing another schematic internal configuration of the multi-chip package of the embodiment 4.

FIG. 8 is a block diagram showing a schematic internal configuration of a multi-chip package of an embodiment 4 in accordance with the present invention. In FIG. 8, the reference numeral 1004 designates an MCP, and reference numerals 1010 and 1020 each designate a semiconductor device incorporated into the MCP 1004. Although the two semiconductor devices usually consist of chips with different types of functions, they may be chips of the same type. In either case, the MCP has a multi-chip structure for supplying data from a first chip to a second chip, or for exchanging data between them.

The present embodiment 4 handles the latter case where they exchange data in the multi-chip structure, in which the chips 1010 and 1020 built in the MCP 1004 have the different types of functions, and correspond to the chip described above in the embodiment 1.

In the chip 1010, the reference numeral 500 designates an internal circuit, reference numerals 410 and 420 each designate an input buffer for the internal circuit 500, and the reference numeral 430 designates an output buffer. Reference numerals 101–103 designate pads that are formed on the chip, and connected to the input terminals of the input buffers 410 and 420, and to the output terminal of the output buffer 430. Reference numerals 105 each designate a pad for another input or output of the internal circuit 500 (not shown for the sake of simplicity). The chip 1010 includes a first pad 111 to be connected to the second chip 1020 and a second pad 112 for making a probing connection for a wafer test. The first pad 111 is connected to the output of the first buffer 450, and the second pad 112 is connected to the output of the second buffer 460. In addition, the output of the first buffer 450 is connected to the input of the second buffer 460. The driving power of the second buffer 460 is designed to be greater than that of the first buffer 450. In the second chip 1020, the reference numeral 501 designates an internal circuit, and 411 designate an input buffer for the internal circuit 501. The reference numeral 201 designates a pad that is formed on the chip and connected to the input terminal of the input buffer 411. Reference numerals 202, 203 and 205 each designate a pad for another input or output of the internal circuit 501 (not shown for the sake of simplicity). The chip 1020 includes a first pad 211 connected to the first chip 1010 and a second pad 212 for making a probing connection for a wafer test. The first pad 211 is connected to the output of the first buffer 451, and the second pad 212 is connected to the output of the second buffer 461. In addition, the output of the first buffer 451 is connected to the input of the second buffer 461. The driving power of the second buffer 461 is designed to be greater than that of the first buffer 451. The two chips 1010 and 1020 have connections for exchanging data. Specifically, the pads 101 and 211 and the pads 111 and 201 are interconnected by wires 711 and 712, respectively. Thus, the output of the buffer 450 of the chip 1010 drives the chip 1020 via the pads 111 and 201, and the output of the buffer 451 of the chip 1020 drives the chip 1010 via the pads 211 and 101. Reference numerals 601–606 designate external terminals of the MCP 1004, which are used by the chip 1010, and connected to the pads 102, 103 and 105 via the wires 703–708. Reference numerals 611–616 designate external terminals of the MCP 1004, which are used by the chip 1020, and connected to the pads 202, 203 and 205 via wires 723–728. The second pad 112 of the chip 1010 is connected to an external terminal 607 via a wire 713. Likewise, the pad 212 of the chip 1020 is connected to an external terminal 617 via a wire 733.

In the chip 1010 assembled into the MCP 1004, the first buffer 450 with the smaller driving power receives the signal output from the internal circuit 500, and supplies it to the first pad 111. The signal is transferred to the pad 201 of the chip 1020 via the wire 712, and arrives at the internal circuit 501 via the input buffer 411. The signal is simultaneously supplied to the second buffer 460 with the greater driving power, and is transferred from the pad 112 to the external terminal 607 via the wire 713. The second buffer 460 can control its active/inactive state in response to its control signal 150. Thus, the second buffer 460 can operate in accordance with its application. For example, in the normal mode, the second buffer 460 is placed in the inactive state so that the pad 112 and external terminal 607 connected to its output are fixed at the "H" or "L" potential or at the high impedance state, whereas in the test mode of the chip 1010, the second buffer 460 is placed in the active state in response to its control signal 150 so that its output signal is transferred to the external terminal 607 via the pad 112 connected to its output. Likewise, in the chip 1020, the first buffer 451 with the smaller driving power receives the signal output from the internal circuit 501, and supplies it to the first pad 211. The signal is transferred to the pad 101 of the chip 1010 via the wire 711, and arrives at the internal circuit 500 via the input buffer 410. The signal is simultaneously supplied to the second buffer 461 with the greater driving power, and is transferred from the pad 212 to the external terminal 617 via the wire 733. The second buffer 461 can control its active/inactive state in response to its control signal 151. Thus, the second buffer 460 can operate in accordance with its application. For example, in the normal mode, the second buffer 461 is placed in the inactive state so that the pad 212 and external terminal 617 connected to its output are fixed at the "H" or "L" potential or at the high impedance state, whereas in the test mode of the chip 1020, the second buffer 461 is placed in the active state in response to its control signal 151 so that its output signal is transferred to the external terminal 617 via the pad 212 connected to its output.

As described above, the present embodiment 4 is configured such that the first buffers 450 and 451 with the smaller driving power drive the other semiconductor devices 1020 and 1010 in the normal mode of the MCP 1004, and that the pads 112 and 212 connected to the second buffers 460 and 461 with the greater driving power are connected to the external terminals 607 and 617, respectively. In addition, the second buffers 460 and 461 can be controlled to the inactive state in response to the control signals 150 and 151. Thus, the present embodiment 4 offers an advantage of being able to prevent the noise generation and to limit an increase in the current consumption during the operation. Furthermore, it can configure the MCP 1004 using the output buffers with the optimum driving power for the MCP. Moreover, since the pads 112 and 212 connected to the second buffers 460 and 461 with the greater driving power are connected to the external terminals 607 and 617, respectively, the outputs of the second buffers 460 and 461 can be used after the chips are assembled into the MCP. For example, since the second buffers 460 and 461 can be controlled to the active/inactive state in response to the control signals 150 and 151, they are applicable to the test of the chips 1010 and 1020.

The chips 1010 and 1020 installed in the MCP 1004, which is an example having the multi-chip structure for exchanging data between the two chips, have the different types of functions, and correspond to the chip as described above in the embodiment 1. The present invention, however, is also applicable to a configuration as shown in FIG. 5 that has a multi-chip structure for transferring data only in one direction from the first chip to the second chip, offering the same advantages.

In addition, although the present embodiment is described by way of example where the chips 1010 and 1020 installed in the MCP 1004, which is an example having the multi-chip structure for exchanging data between the two chips, have the different types of functions, and correspond to the chip as described above in the embodiment 1, and the second buffers 460 and 461 are connected to the external terminals 607 and 617 via the pads 112 and 212, this is not essential. For example, a configuration is also possible in which one of the second buffers 460 and 461 is connected to one of the external terminals 607 and 617, offering the same advantages.

EMBODIMENT 5

Figure 10:
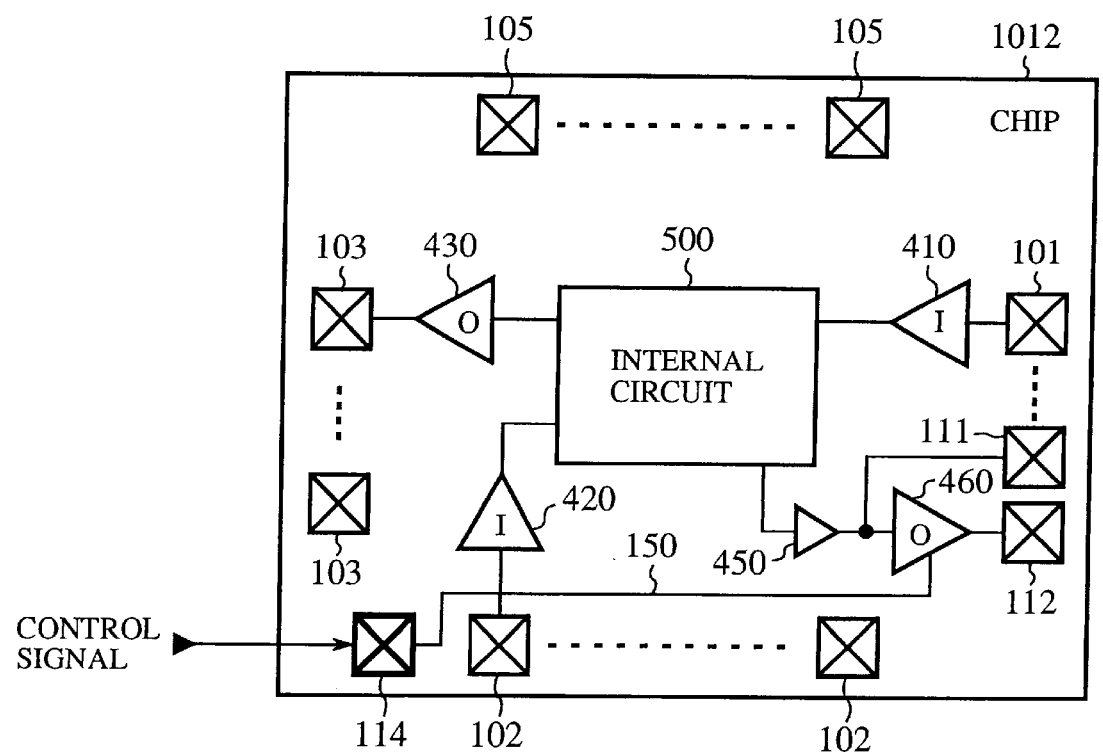
FIG. 10 is a block diagram showing a schematic configuration of a chip to be installed into a multi-chip package of an embodiment 5 in accordance with the present invention.

FIG. 10 is a block diagram showing a schematic configuration of a chip (semiconductor device) to be installed in a multi-chip package of an embodiment 5 in accordance with the present invention. The reference numeral 1012 designates a chip (semiconductor device). In the chip 1012, the reference numeral 500 designates an internal circuit, reference numerals 410 and 420 each designate an input buffer for the internal circuit 500, and the reference numeral 430 designates an output buffer. Reference numerals 101–103 designate pads that are formed on the chip, and connected to the input terminals of the input buffers 410 and 420, and to the output terminal of the output buffer 430. Reference numerals 105 each designate a pad for another input or output of the internal circuit 500 (not shown for the sake of simplicity) The chip 1012 is a semiconductor device to be incorporated into the MCP. It has a first pad 111 to be connected to an another semiconductor device, and a second pad 112 for making a probing connection for a wafer test. The first pad 111 is connected to the output of the first buffer 450, and the second pad 112 is connected to the output of the second buffer 460. In addition, the output of the first buffer 450 is connected to the input of the second buffer 460. The driving power of the second buffer 460 is designed to be greater than that of the first buffer 450. The control signal 150 of the second buffer 460 is connected to a pad 114.

The present embodiment 5 differs from the embodiment 1 in that the control signal 150 of the second buffer 460 is supplied via the pad 114.

As described above, the present embodiment 5 is configured such that the chip 1012 includes the first pad 111 to be connected to the another semiconductor device installed in the MCP; the second pad 112 for making the probing connection in the wafer test; the first buffer 450 for driving the another semiconductor device to be connected to the first pad 111; and the second buffer 460, being driven by the first buffer 450, drives the load capacitance of the tester connected to the second pad 112 by the driving power greater than that of the first buffer 450, and has its active/inactive state controlled in response to the control signal 150. Thus, the present embodiment 5 drives the another semiconductor device by the first buffer 450 with the smaller driving power after the assembly, whereas it drives the load capacitance of the tester by the second buffer 460 with the greater driving power in the wafer test. As a result, the present embodiment 5 offers an advantage of being able to prevent the noise generation and to limit the increase in the current consumption during the operation. Furthermore, connecting the control signal 150 of the second buffer 460 to the pad 114 facilitates the external control of the active/inactive state of the second buffer 460.

EMBODIMENT 6

Figure 11:
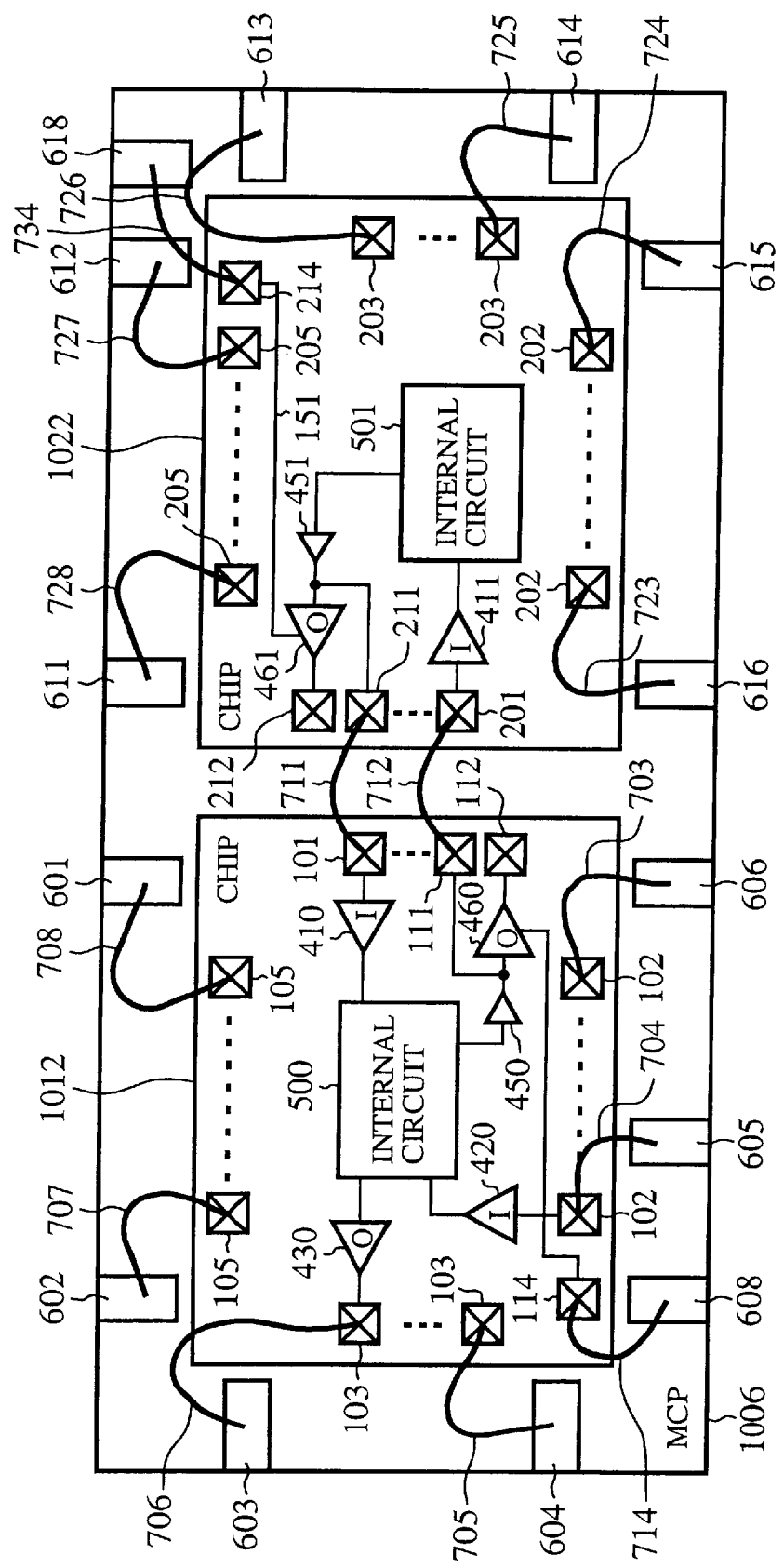
FIG. 11 is a block diagram showing a schematic internal configuration of a multi-chip package of an embodiment 6 in accordance with the present invention.

FIG. 11 is a block diagram showing a schematic internal configuration of a multi-chip package of an embodiment 6 in accordance with the present invention. In FIG. 11, the reference numeral 1006 designates an MCP, and reference numerals 1012 and 1022 each designate a semiconductor device incorporated into the MCP 1006. Although the two semiconductor devices usually consist of chips with different types of functions, they may be chips of the same type. In either case, the MCP has a multi-chip structure for supplying data from a first chip to a second chip, or for exchanging data between them.

The chips 1012 and 1022 built in the MCP 1006, which employs the multi-chip structure to exchange data between the two chips, have the different types of functions, and correspond to the chip described above in the embodiment 5.

In the chip 1012, the reference numeral 500 designates an internal circuit, reference numerals 410 and 420 each designate an input buffer for the internal circuit 500, and the reference numeral 430 designates an output buffer. Reference numerals 101–103 designate pads that are formed on the chip, and connected to the input terminals of the input buffers 410 and 420, and to the output terminal of the output buffer 430. Reference numerals 105 each designate a pad for another input or output of the internal circuit 500 (not shown for the sake of simplicity). The chip 1012 includes a first pad 111 connected to the second chip 1022 and a second pad 112 for making a probing connection for a wafer test. The first pad 111 is connected to the output of the first buffer 450, and the second pad 112 is connected to the output of the second buffer 460. In addition, the output of the first buffer 450 is connected to the input of the second buffer 460. The driving power of the second buffer 460 is designed to be greater than that of the first buffer 450. The control signal 150 of the second buffer 460 is connected to a pad 114.

In the second chip 1022, the reference numeral 501 designates an internal circuit, and 411 designate an input buffer for the internal circuit 501. The reference numeral 201 designates a pad that is formed on the chip and connected to the input terminal of the input buffer 411. Reference numerals 202, 203 and 205 each designate a pad for another input or output of the internal circuit 501 (not shown for the sake of simplicity). The chip 1022 includes a first pad 211 connected to the second chip 1012 and a second pad 212 for making a probing connection for a wafer test. The first pad 211 is connected to the output of the first buffer 451, and the second pad 212 is connected to the output of the second buffer 461. In addition, the output of the first buffer 451 is connected to the input of the second buffer 461. The driving power of the second buffer 461 is designed to be greater than that of the first buffer 451. The control signal 151 of the second buffer 461 is connected to a pad 214. The two chips 1012 and 1022 have connections for exchanging data. Specifically, the pads 101 and 211 and the pads 111 and 201 are interconnected by wires 711 and 712, respectively. Thus, the output of the buffer 450 of the chip 1012 drives the chip 1022 via the pads 111 and 201, and the output of the buffer 451 of the chip 1022 drives the chip 1012 via the pads 211 and 101. Reference numerals 601–606 designate external terminals of the MCP 1006, which are used by the chip 1012, and connected to the pads 102, 103 and 105 via the wires 703–708. Reference numerals 611–616 designate external terminals of the MCP 1006, which are used by the chip 1022, and connected to the pads 202, 203 and 205 via wires 723–728. The second pad 112 of the chip 1012 and the pad 212 of the chip 1022 are placed at the open state without wiring. The pad 114, which is connected to the control signal 150 of the second buffer 460 in the chip 1012, and the pad 214, which is connected to the control signal 151 of the second buffer 461 in the chip 1022, are connected to the external terminals 608 and 618 via the wires 714 and 734, respectively.

In the chip 1012 assembled into the MCP 1006, the first buffer 450 with the smaller driving power receives the signal output from the internal circuit 500, and supplies it to the first pad 111. The signal is transferred to the pad 201 of the chip 1022 via the wire 712, and arrives at the internal circuit 501 via the input buffer 411. The signal is simultaneously supplied to the second buffer 460 with the greater driving power. However, after the assembly of the MCP 1006, since the second buffer 460 is controlled to the inactive state in response to the control signal 150 fed from the external terminal 608, the pad 112 connected to its output is fixed at the "H" or "L" potential, or brought to the high impedance state. Likewise, in the chip 1022, the first buffer 451 with the smaller driving power receives the signal output from the internal circuit 501, and supplies it to the first pad 211. The signal is transferred to the pad 101 of the chip 1012 via the wire 711, and arrives at the internal circuit 500 via the input buffer 410. The signal is simultaneously supplied to the second buffer 461 with the greater driving power. However, after assembled into the MCP 1006, the second buffer 461 is controlled to the inactive state in response to the control signal 151 fed from the external terminal 618. Thus, the pad 212 connected to its output is fixed at the "H" or "L" potential, or brought to the high impedance state.

As described above, the present embodiment 6 is configured such that the first buffers 450 and 451 with the smaller driving power drive the other semiconductor devices 1022 and 1012 assembled into the MCP 1006, and that the pads 112 and 212 connected to the second buffers 460 and 461 with the greater driving power are placed at the open state. In addition, the second buffers 460 and 461 are controlled to the inactive state in response to the control signals 150 and 151 fed from the external terminals 608 and 618. Thus, the present embodiment 6 offers an advantage of being able to prevent the noise generation and to limit an increase in the current consumption during the operation. Furthermore, it can configure the MCP 1006 using the output buffers with the optimum driving power for the MCP. Moreover, connecting the pads 114 and 214, which are connected to the control signals 150 and 151 of the second buffers 460 and 461, to the external terminals 608 and 618 can facilitate the control of the active/inactive state of the second buffers 460 and 461 even after the packaging.

Figure 12:
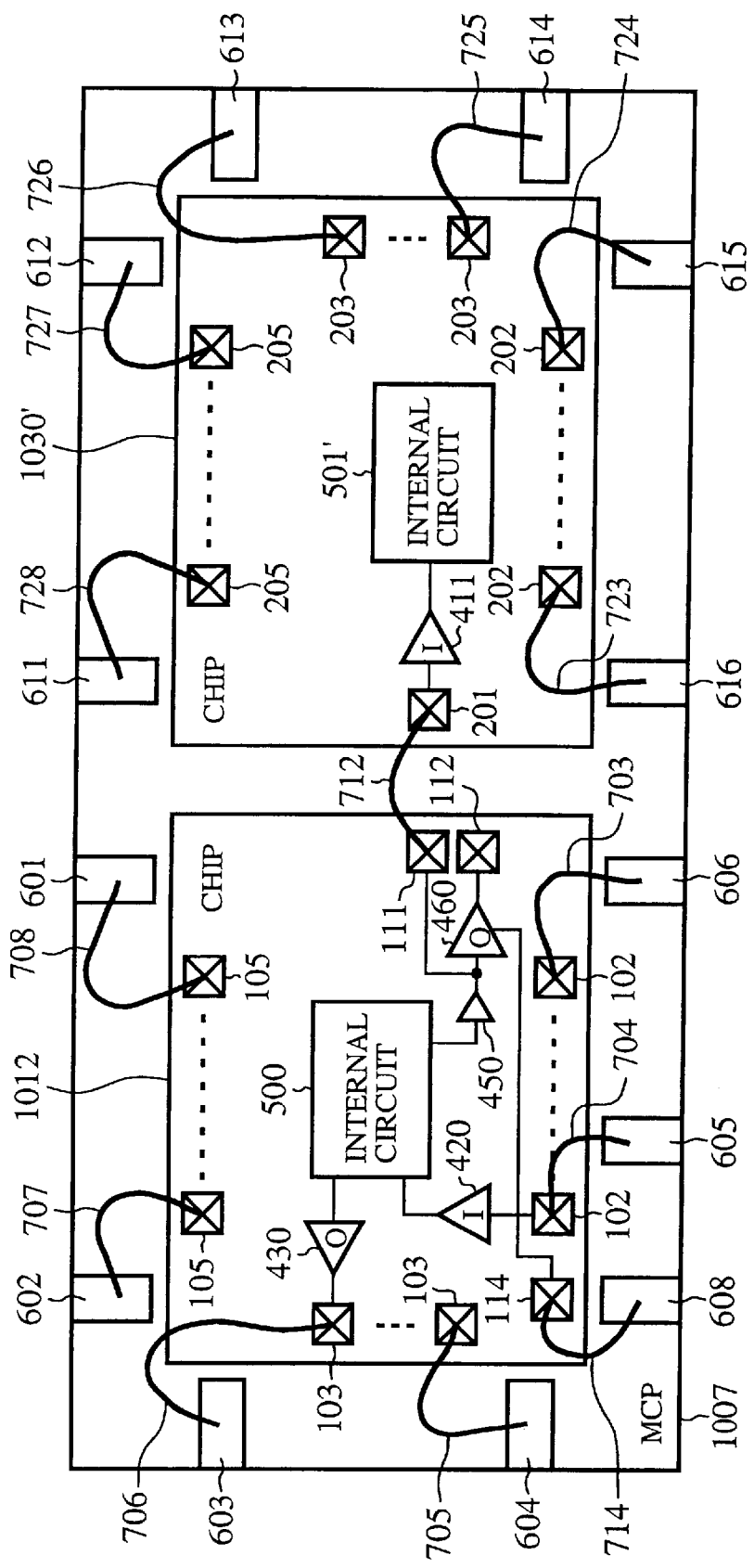
FIG. 12 is a block diagram showing another schematic internal configuration of the multi-chip package of the embodiment 6 in accordance with the present invention.
Figure 13:
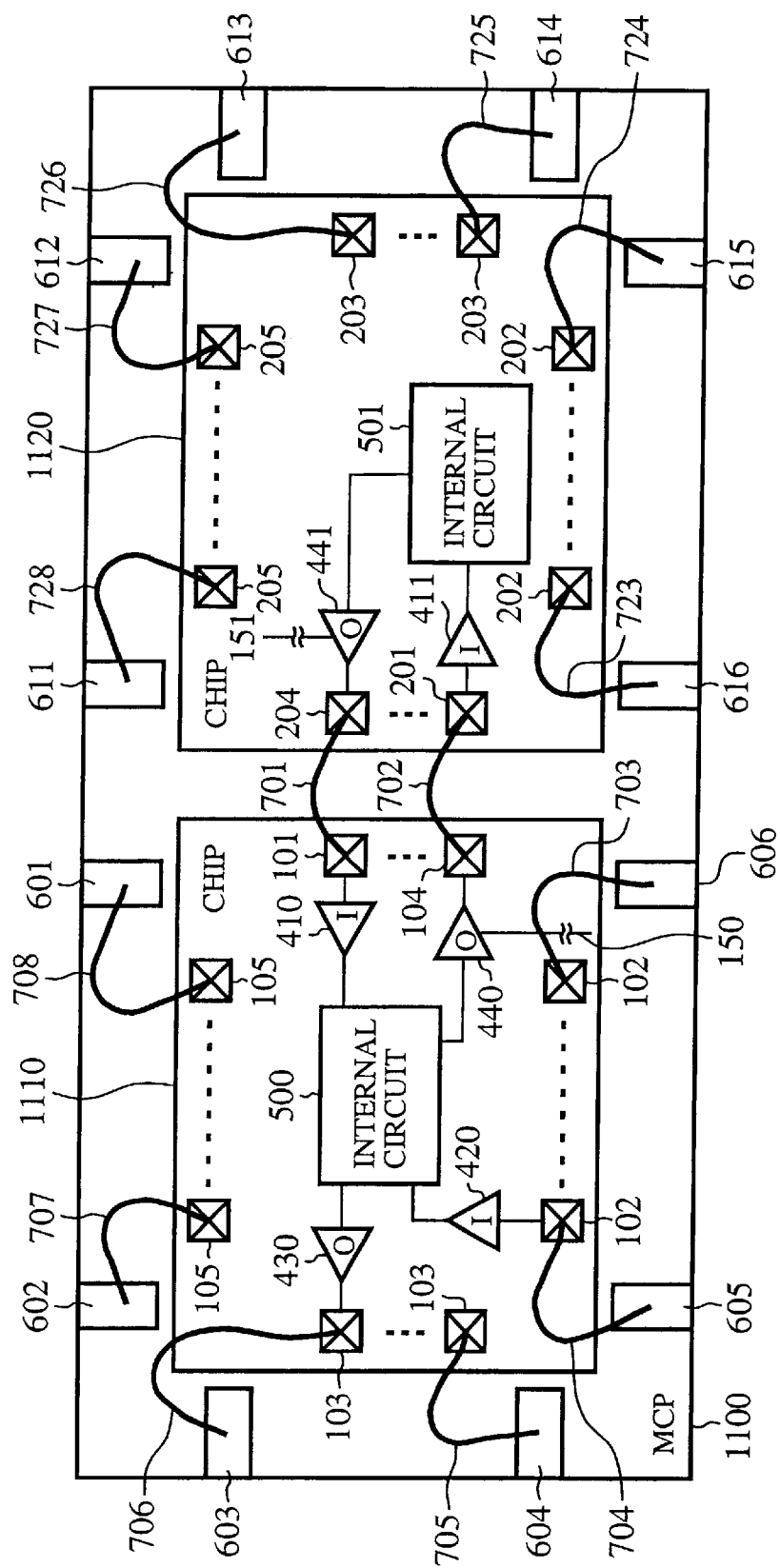
FIG. 13 is a block diagram showing a schematic internal configuration of a conventional multi-chip package.

The chips 1012 and 1022 installed in the MCP 1006, which is an example having the multi-chip structure for exchanging data between the two chips, have the different types of functions, and correspond to the chip as described above in the embodiment 5. The present invention, however, is also applicable to a configuration as shown in FIG. 12 that has a multi-chip structure for transferring data only in one direction from the first chip to the second chip, offering the same advantages.

In addition, although the present embodiment 6 is described by way of example where the chips 1012 and 1022 installed in the MCP 1006, which is an example having the multi-chip structure for exchanging data between the two chips, have the different types of functions, and correspond to the chip as described above in the embodiment 5, and the second buffers 460 and 461 are connected to the external terminals 608 and 618 via the pads 114 and 214, this is not essential. For example, a configuration is also possible in which only one of the second buffers 460 and 461 is connected to one of the external terminals 608 and 618, offering the same advantages.

Incidentally, although the foregoing embodiments in accordance with the present invention use wires for the assembly, they can use bumps instead for making connections. In addition, although the MCPs each have a two-chip configuration, they can include three or more chips.

What is claimed is:

1. A semiconductor device comprising:
   a first pad to be connected to another semiconductor device;
   a second pad for making a probing connection in a wafer test;
   a first buffer connected to said first pad for driving the another semiconductor device; and
   a second buffer driven by said first buffer, for driving a load capacitance of a tester connected to said second pad by driving power greater than driving power of said first buffer, said second buffer having its active/inactive state controlled by a control signal.

2. The semiconductor device according to claim 1, wherein said second pad is smaller than said first pad in size.

3. The semiconductor device according to claim 1, further comprising a pad for directly supplying said second buffer with the control signal for controlling the active/inactive state of said second buffer.

4. The semiconductor device according to claim 2, further comprising a pad for directly supplying said second buffer with the control signal for controlling the active/inactive state of said second buffer.

5. A multi-chip package including at least a first chip and a second chip, said first chip comprising:
   a first pad connected to said second chip;
   a second pad for making a probing connection in a wafer test;
   a first buffer connected to said first pad for driving said second chip; and
   a second buffer that has driving power greater than that of said first buffer, and that being driven by said first buffer, drives a load capacitance of a tester connected to said second pad, wherein
   said second buffer is controlled by a control signal to an active state during the wafer test, and to an inactive state during a normal operation of said multi-chip package.

6. The multi-chip package according to claim 5, wherein said second pad is smaller than said first pad in size.

7. The multi-chip package according to claim 5, further comprising a pad for directly supplying said second buffer with the control signal for controlling the active/inactive state of said second buffer.

8. The multi-chip package according to claim 6, further comprising a pad for directly supplying said second buffer with the control signal for controlling the active/inactive state of said second buffer.

9. The multi-chip package according to claim 5, wherein said second chip has a configuration corresponding to that of said first chip, and said first chip and said second chip exchange data between them.

10. The multi-chip package according to claim 5, wherein said second chip has a configuration different from that of said first chip, and data is transferred only in one direction from said first chip to said second chip.

* * * * *